United States Patent [19]

Imai et al.

[11] 4,435,443

[45] * Mar. 6, 1984

[54] METHOD FOR FORMING A PROTECTING FILM ON SIDE WALLS OF A SEMICONDUCTOR DEVICE

[75] Inventors: Hajime Imai, Tokyo; Masahiro Morimoto, Yokohama; Takao Fujiwara, Kawasaki, all of Japan

[73] Assignee: Fujitsu Limited, Kawasaki, Japan

[*] Notice: The portion of the term of this patent subsequent to Oct. 26, 1999 has been disclaimed.

[21] Appl. No.: 389,916

[22] Filed: Jun. 18, 1982

Related U.S. Application Data

[63] Continuation of Ser. No. 223,152, Jan. 7, 1981, Pat. No. 4,356,210, which is a continuation of Ser. No. 62,415, Jul. 30, 1979, abandoned.

[30] Foreign Application Priority Data

Jul. 29, 1978 [JP] Japan .................................. 53-92777
Dec. 1, 1978 [JP] Japan .................................. 53-148838

[51] Int. Cl.³ ........................ B05D 3/06; C23C 17/00
[52] U.S. Cl. ................................. 427/38; 204/192 P; 427/43.1
[58] Field of Search ................. 427/38, 43.1; 204/96, 204/192 R, 192 C, 192 P

[56] References Cited

U.S. PATENT DOCUMENTS 3,519,788  7/1970  Hatzakis ............................. 427/43.1
3,846,294  11/1974  Vossen ......................... 204/192 EC
4,172,907  10/1979  Mones et al. ......................... 427/96

OTHER PUBLICATIONS

Ladany et al., "App. Phys. Lett.," vol. 30, No. 2, pp. 87–88, 1977.
Shima et al., "App. Phys. Lett.," vol. 31, No. 9, pp. 625–627, 1977.
Barnes et al., "J. Appl. Phys.," vol. 49, No. 5, pp. 2981–2982.

Primary Examiner—John H. Newsome
Attorney, Agent, or Firm—Staas & Halsey

[57] ABSTRACT

A method for forming a protecting film on the side walls of a semiconductor device, e.g. a semiconductor laser, having an exposed PN junction at the side walls thereof is carried out by the following steps. The semiconductor device is placed on a substrate target made of a protecting film material. Energetic particles are impinged against the substrate target. Particles of the material are emitted from the substrate target and deposited on only the side walls to form the protecting film.

23 Claims, 8 Drawing Figures

METHOD FOR FORMING A PROTECTING FILM ON SIDE WALLS OF A SEMICONDUCTOR DEVICE

This is a continuation of application Ser. No. 223,152, filed Jan. 7, 1981, now U.S. Pat. No. 4,356,210, which is a continuation of application Ser. No. 62,415, filed July 30, 1979, now abandoned.

BACKGROUND OF THE INVENTION

1. Field of the Invention

The present invention relates to a semiconductor device, and more specifically, to a method for forming a protecting film on the side walls of a semiconductor device in an atmosphere including energetic particles.

2. Description of the Prior Art

In order to prolong the operating life of a semiconductor device, the semiconductor device is generally covered with a protecting film. In particular, in the case of a semiconductor device having an exposed PN junction at the side walls thereof, for example, a semiconductor laser, a light emitting diode, etc., the side walls should be covered with a protecting film. Unless the side walls are covered, the operating life of a semiconductor laser can be reduced by a so called "facet damage". Accordingly, as the protecting film, an $Al_2O_3$ film, an $SiO_2$ film or a $PbO$—$SiO_2$ glass film has heretofore been formed on the facets, i.e. the side walls of a semiconductor laser, by using a vacuum evaporation method, a chemical vapor deposition method or a sputtering method (for example, see 1. Ladany et al, Applied Physics Letter, Vol. 30, No. 2, pp. 87–88 (1977); Y. Shima et al, Applied Physics Letter, Vol 31, No. 9, pp. 625–627 (1977), and; P. A. Barnes et al, Journal of Applied Physics, Vol. 49, No. 5, pp. 2981–2982 (1978).

When the protecting film is formed by the chemical vapor deposition method of by Y. Shima et al, the protecting film covers not only the side walls but, also, the upper surface (i.e. the electrode layer) of the semiconductor laser. In order to cover only the side walls of the semiconductor laser with the protecting film, it is necessary to remove an unnecessary part of the protecting film by an etching method after the formation of the protecting film. Namely, a part of the formed protecting film which covers the side walls of the semiconductor laser is covered with wax, e.g. piccin, and then, the remaining part of the formed film which is not covered with the wax and which covers the electrode layer is removed by an appropriate etchant. However, as a result of this treatment, the surface of the remaining protecting film is contaminated with adhering particles of the wax, and the etchant penetrates between the protecting film and the side walls of the semiconductor laser, so that several properties of the semiconductor laser are frequently deteriorated, for example, the threshold current is increased, and further, the operating life is not prolonged.

Sputtering is well-known to those skilled in the art as a method for forming a protecting film (for example, see L. Holland: Science and Technology of Surface Coating, ed. by Brian N. Chapman and J. C. Anderson, (1974), pp. 369–385, Academic Press London and New York). Sputtering is a preferred method of deposition due to the large area of uniform deposition and the excellent adhesion of a sputtered film. Since the deposition rate of sputtering is low, the thickness control of the sputtered film is precise. In a conventional sputtering method, a protecting film of a semiconductor device is formed by bombarding a target made of a protecting film material with ions of inert gas, to sputter particles of the protecting film material from the target, and to deposit the sputtered particles on the semiconductor device which is located away from the target. Thus, the formed protecting film covers the entire exposed surface including the side walls of the semiconductor device.

SUMMARY OF THE INVENTION

It is a primary object of the present invention to provide a method for forming a protecting film on only the side walls of a semiconductor device at which walls a PN junction is exposed.

It is another object of the present invention to provide a method for forming a protecting film by using energetic particles, e.g. ions of inert gas.

It is another object of the present invention to provide a method for forming a protecting film on only the side walls of a semiconductor device without necessitating additional steps to complete the formation of a protecting film.

It is a further object of the present invention to provide a method for forming a protecting film which can prolong the operating life of a semiconductor device.

It is a still further object of the present invention to provide a method for forming a protecting film comprising protecting multilayers.

It is another object of the present invention to provide a method for forming a protecting film as an optical coating on a photo-electric transducer.

It is still another object of the present invention to control the thickness of a protecting film so as to change the reflectivity of the side walls of a semiconductor device.

The above and other objects of the present invention are attained by a method for forming a protecting film which comprises at least one protecting layer on only the side walls of a semiconductor device, at which walls an active layer (i.e. a PN junction or an active layer) is exposed, the method comprising the steps of: placing the semiconductor device on a substrate made of a protecting layer material, the substrate being used as a target; placing the substrate target with the semiconductor device in an atmosphere including energetic particles; and impinging the energetic particles against the substrate target and the semiconductor device, so that particles of the material are emitted from said substrate target and deposited on the side walls to form the protecting layer.

The invention will become more apparent from the description of the preferred embodiments of the invention set forth below, with reference to the accompanying drawings.

DETAILED DESCRIPTION OF THE INVENTION

Figure 1:
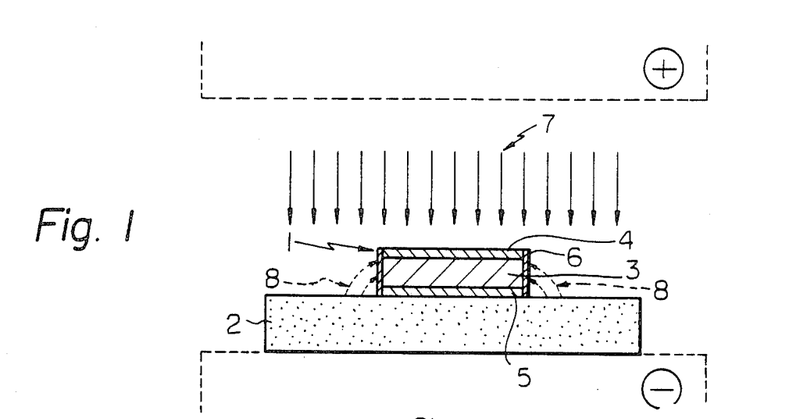
FIG. 1 is a cross-sectional view of a semiconductor device and a substrate made of a protecting layer material, when energetic particles impinge against them in accordance with the method of the invention.

Referring now to FIG. 1, there is illustrated a semiconductor device 1 and a substrate 2 made of a protecting film material. The semiconductor device 1 comprises a semiconductor body 3 having at least one exposed PN junction at the side walls thereof, and electrode layers 4 and 5. The semiconductor device may not be provided with the electrode layer 5. The semiconductor device 1 is provided with a protecting film 6, which is formed in accordance with the method of the present invention.

The formation of the protecting film on only the side walls of a semiconductor device is carried out by the following procedure. The semiconductor device 1 is placed on the substrate 2 as illustrated in FIG. 1. The substrate 2 with the semiconductor device 1 is placed in an apparatus for generating energetic particles, e.g. a conventional R.F. sputtering apparatus, and is used as a target. Ions 7 of inert gas, e.g. argon gas or xenon gas, generated as the energetic particles in the sputtering apparatus impinge against the substrate 2 and the electrode layer 4 in an electric field which is generated with a positive electrode and a negative electrode (illustrated with broken lines in FIG. 1). By such sputtering particles 8 of the protecting film material are sputtered from the substrate 2. The sputtered particles 8 are deposited on the side walls of the semiconductor device 1 to form a protecting film 6 on only the side walls (as illustrated in FIG. 1).

The above-mentioned semiconductor device is an electro-luminescence device (e.g. a semiconductor laser or a light emitting diode), a photo detector (a photo diode, a photo transistor or an avalanche photo diode) or, another type of semiconductor device having at least one exposed PN junction at the side walls thereof (a diode, a transistor, a thyristor, or an IMPATT diode or a semiconductor device having at least one exposed area at the side walls thereof (a Gunn-diode).

The above-mentioned protecting film can be made of a protecting single layer or protecting multilayers. In the case of the protecting single layer, the protecting film is formed in the above-mentioned manner and is made of one material selected from the group consisting of $Al_2O_3$, $SiO_2$, $Si_3N_4$, $TiO_2$, SiC, BN, $CaF_2$, $MgF_2$, AlF, Si, Ge, GaAs, GaAlAs, GaP, InP, InGaAs, InGaAsP and InGaAsSb. In the case where the semiconductor device is a semiconductor laser, the thickness of the protecting film to be formed should be a half wavelength d ($d=\lambda/2n$, wherein $\lambda$ is the lasing wavelength of the semiconductor laser and n is the refractive index of the formed protecting layer, thickness in this respect denoting optical thickness), since a protecting film of a half wavelength can maintain the normal facet reflectivity and, thus, the normal threshold current. It is also possible to form the protecting film so that it has a thickness of a quarter wavelength d ($d=\lambda/4n$), since the external efficiency of the semiconductor laser with a protecting film having a thickness of a quarter wavelength is larger than that of the semiconductor laser having a protecting film having a thickness of a half wavelength. In the case where the semiconductor device is a light emitting diode it is preferable that the thickness of the protecting film to be formed be a quarter wavelength d ($d=\lambda/4n$, wherein $\lambda$ is the light emitting wavelength thereof and n is the refractive index of the formed protecting film), since the protecting film of the quarter wavelength decreases the reflectivity as low as possible. Furthermore, if the semiconductor device is a photo detector, the thickness of the protecting film to be formed should be a quarter wavelength d ($d=\lambda/4n$, wherein $\lambda$ is the wavelength at the maximum spectral sensitivity of the photo detector and n is the refractive index of the protecting film), since the protecting film of the quarter wavelength can function as an antireflection film.

In the case where the protecting film is made up of protecting multilayers, the protecting multilayers are formed by repeating the above-mentioned procedure, except that in the next sputtering treatment a substrate to be used is made of a different protecting layer material from the protecting layer material used in the previous sputtering treatment. In order to control the reflectivity of the side walls of the semiconductor device, the protecting film can be made of a predetermined number of protecting layers. For example, the protecting film can be made of three protecting layers. Such a three protecting layer structure is useful in a semiconductor laser, since the multilayer structure can increase the reflectivity of the side walls, which reduces the threshold current of the semiconductor layer. It is preferable that the first and third protecting layers be made of one material selected from the group consisting of $Al_2O_3$, $SiO_2$, SiC, BN, $CaF_2$, $MgF_2$ and AlF and that the second layer be made of metal (e.g. Au, Ag, Ti, W or Al) or one material selected from the group consisting of Si, Ge, GaAs, GaAlAs, GaP, InP, InGaAs, InGaAsP and InGaAsSb. The second protecting layer should have a higher refractive index than the first and third protecting layers.

Concerning the thickness of the above-mentioned protecting layers of the semiconductor laser the first and second protecting layers should be quarter wavelengths $d_1$ and $d_2$, respectively, ($d_1=\lambda/4n_1$, $d_2=\lambda/4n_2$, wherein is the lasing wave length and $n_1$ and $n_2$ are the refractive indexes of the first and second protecting layers, respectively,) and the third protecting layer should be a half wavelength $d_3=\lambda/2n_3$, wherein $n_3$ is the refractive index of the third protecting layer.

It is possible to form a protecting film which comprises a protecting layer covering one side wall of a semiconductor laser and protecting multilayers covering the opposite side wall of the semiconductor laser.

Figure 2:
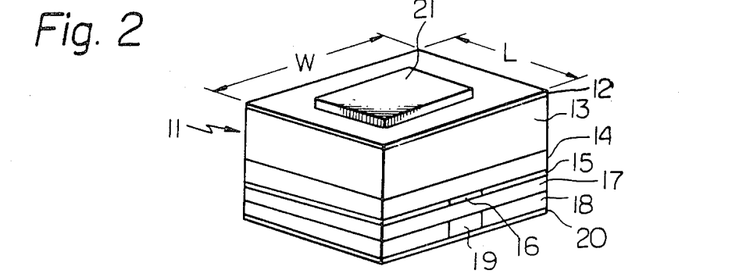
FIG. 2 is a perspective view of a semiconductor laser.
Figure 3:
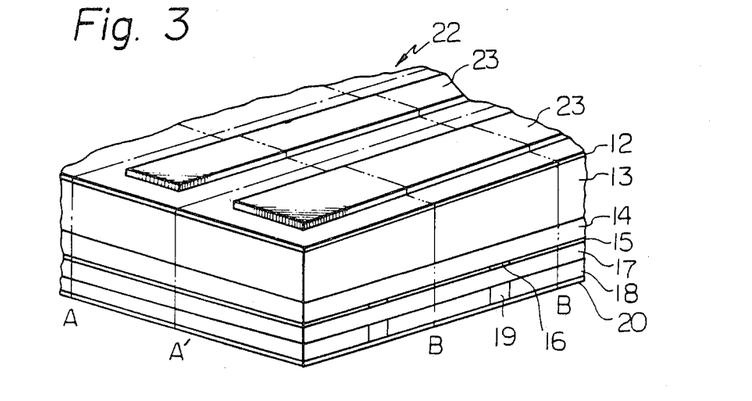
FIG. 3 is a partial perspective view of a semiconductor substrate for semiconductor lasers.

When the formation of the protecting film is carried out in accordance with the method of the invention, the exposed electrode layer of the semiconductor device is inevitably sputter-etched. Accordingly, the thickness of the electrode layer should be increased. However, when the semiconductor device is formed by cleaving a semiconductor substrate, a thick electrode layer impedes the normal cleaving. Accordingly, in such a case, it is preferable to form island-shaped electrodes, as illustrated in FIG. 2, on the semiconductor substrate. In the case where the cleaving length of the semiconductor substrate with the island-shaped electrodes is long, during the cleaving treatment undesirable cracks and splits frequently occur, so that it is difficult to cleave the semiconductor substrate completely. In this case, it is preferable to form belt-shaped electrodes in parallel with the cleavage direction, as illustrated in FIG. 3, on the semiconductor substrate. Furthermore, when the semiconductor substrate with the belt-shaped electrode is cleaved, it is preferable that first, the semiconductor substrate be bisected into two equal pieces, then, each of the equal pieces also be bisected, and after that, such bisecting treatment be repeated to form many bars including small seconductor pieces, each of which has one of the belt-shaped electrodes. Due to the belt-shaped electrodes and the above-mentioned bisecting treatment, such a long semiconductor substrate and the bisected pieces can be cleaved completely.

In the case where the cleaved bar with only one belt-shape electrode is divided into the semiconductor devices in the perpendicular direction to the cleavage direction, undesirable splits do not occur during the dividing treatment, since the dividing length is short.

The invention will be understood more readily from the following examples.

EXAMPLE 1

A semiconductor laser 11 (FIG. 2), of a GaAs—GaAlAs double-heterojunction structure type, was placed on an aluminum oxide ($Al_2O_3$) substrate as illustrated in FIG. 1. The semiconductor laser 11 comprised an electrode (AuGe/Ni alloy) layer 12 which was 0.3 $\mu$m thick, an N type GaAs layer 13 which was 100 $\mu$m thick, an N type $Ga_{1-y}Al_yAs$ layer 14 which was 2 $\mu$m thick, a P type $Ga_{1-x}Al_xAs$ layer 15 which was 0.1 $\mu$m thick and was an active layer which had a lasing portion 16, a P type $Ga_{1-y}Al_yAs$ layer 17 which was 1.5 $\mu$m thick, an N type GaAs layer 18 which was 1.5 $\mu$m thick and had a P type diffused portion 19, and an electrode (TiPtAu alloy) layer 20 which was 0.5 $\mu$m thick (wherein x=0.05 and y=0.35). In addition, the semiconductor device 11 was provided with an island-shaped electrode film 21 which was 5 $\mu$m thick, and which was made of gold (Au) by a conventional plating method. The size of the semiconductor device 11 was 250 $\mu$m in length and 300 $\mu$m in width. The lasing wavelength of the semiconductor laser 11 was 0.85 $\mu$m.

The $Al_2O_3$ substrate with the semiconductor laser 11 was placed in a conventional R.F. (radio frequency) sputtering apparatus and used as a target. The inside pressure of the sputtering apparatus was reduced to $1 \times 10^{-6}$ torr. Then, argon gas was introduced into the sputtering apparatus and an inside pressure of $5 \times 10^{-4}$ torr was maintained. Ions of the argon gas were generated by using a radio frequency power of 500 W (the frequency being 13.56 MHz and the peak applied voltage being 1 kV), and the $Al_2O_3$ substrate, electrode layer 12 and film 21 were bombarded with the generated ions. Accordingly, alumina ($Al_2O_3$) particles were sputtered and the sputtered particles deposited on the side walls of the semiconductor layer 11. As a result of the sputtering, an $Al_2O_3$ protecting film which was 0.26 $\mu$m thick (i.e. a quarter wavelength) was formed on the side walls only. In this case the deposition rate was 0.01 $\mu$m/min. During the sputtering the electrode layer 12 and film 21 were also sputtered, so that the thicknesses of the electrode film 21 was decreased by 3 $\mu$m and the GaAs layer 13 was etched. However, such etching of the GaAs layer 13 did not affect the properties of the semiconductor laser.

EXAMPLE 2

In order to produce a semiconductor laser having a protecting single layer on one of the two mirror surfaces (i.e. side walls) thereof and protecting multilayers on the other opposite side surface, a semiconductor wafer 22 (FIG. 3) with dimensions of approximately 10 mm by 10 mm was produced by a conventional procedure. The semiconductor wafer 22 comprised many semiconductor lasers, each of which had the same multilayer structure as that of the semiconductor laser 11 described in Example 1. The reference numerals 12 through 20 in FIG. 3 correspond to the reference numerals 12 through 20 in FIG. 2, respectively.

On the electrode layer 12 of the semiconductor wafer 22 a large number of belt-shaped electrodes 23, each of which was 8 $\mu$m thick, were formed in parallel to the cleavage direction of the semiconductor wafer by a conventional plating method. In this case the belt-shaped electrodes 23 were formed with a length of approximately 5 mm and, then, the semiconductor wafer 22 was divided (i.e. cleaved) to form several pieces with dimensions of approximately 5 mm by 4 mm. One of the pieces is illustrated in FIG. 1(A).

Figure 4:
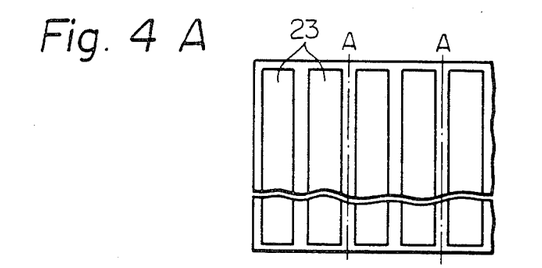
FIGS. 4A, 4B and 4C are schematic plan views of semiconductor lasers in various stages of production.

Each of the pieces was cleaved along chain lines A (FIGS. 3 and 4A), so as to form bars 24, each of which had two belt-shaped electrodes 23, as illustrated in FIG. 4(B). The dimensions of each of the cleaved bars 24 were 5 mm by 500 $\mu$m. When such cleaving was carried out, first, the semiconductor piece was bisected into two equal parts, then, each of the equal parts was also bisected, and such bisecting treatment was repeated to form many cleaved bars 24. Then, the bars were placed on an aluminum oxide ($Al_2O_3$) substrate and the $Al_2O_3$ substrate was placed in the R.F. sputtering apparatus used in Example 1. The sputtering was carried out in the same manner as described in Example 1 to form a protecting layer 25 made of $Al_2O_3$ on the side walls of the cleaved bar 24. The thickness of the protecting layer 25 was 0.13 $\mu$m, namely, a quarter wavelength. Next, the bar 24 covered with the $Al_2O_3$ layer 25 was placed on a silicon (Si) substrate and the Si substrate was placed in the R.F. sputtering apparatus. The sputtering was carried out in the same manner as described in Example 1 to form a second protecting layer 26 made of Si. The thickness of the second protecting layer 26 was 0.07 $\mu$m, namely, a quarter wavelength.

Each of the bars 24 was recleaved along a chain line A' (FIGS. 3 and 4B) to divide it into two bars 27 as illustrated in FIG. 4C. The dimensions of the recleaved bars 27 were 5 mm by 250 $\mu$m. Then, a large number of the recleaved bars 27 were placed on an aluminum oxide ($Al_2O_3$) substrate and the $Al_2O_3$ substrate was placed in the sputtering apparatus. The sputtering was carried out in the same manner as described in Example 1 to form a third protecting layer 28 made of $Al_2O_3$. The thickness of the third protecting layer 28 was 0.26 $\mu$m, namely, a half wavelength. Thus, the sputtering was carried out three times, so that the belt-shaped electrode was sputter-etched to decrease the thickness thereof to 4 $\mu$m.

Finally, each of the cleaved bars 27 was divided (i.e. cleaved) along chain lines B (FIG. 3), namely in the perpendicular direction to the cleavage plane covered by the formed protecting layers, so that sixteen semiconductor lasers were produced. Each of the semiconductor lasers was 250 $\mu$m in length, 300 $\mu$m in width and approximately 100 $\mu$m in thickness, and had the protecting single layer on one mirror surface (i.e. side wall), the three protecting layers on the opposite mirror surface (i.e. opposite side wall) and two exposed walls. However, the exposed walls of the semiconductor laser did not affect the properties of the semiconductor laser.

Figure 5:
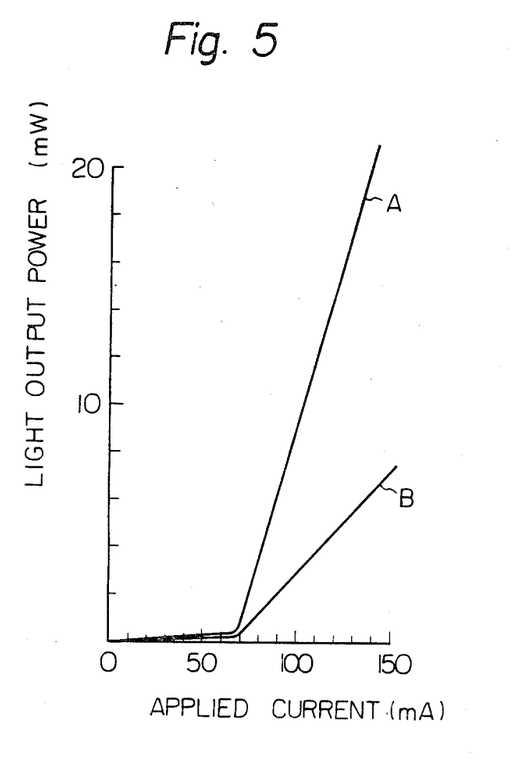
FIG. 5 is a graph showing the relationship between the light output power and the applied current of a semiconductor laser having a protecting film which is formed in accordance with the method of the present invention.

The relationship between the light output power from one side wall (i.e. one facet) of the produced semiconductor laser and an applied current for lasing is shown in FIG. 5. The solid line A indicates the light output power from the side wall coated with only one protecting layer, and the solid line B indicates the light output power from the opposite side wall coated with the three protecting layers.

In order to observe the change in the threshold current of a semiconductor laser, in addition to the produced semiconductor laser mentioned above, two types of semiconductor lasers were produced by utilizing some of the steps of the above-mentioned production process. Each of the two types of semiconductor lasers had an $Al_2O_3$ protecting layer with a thickness of a half wavelength on one of the two side walls (i.e. two mirror surfaces) thereof, and had no protecting layer or two protecting layers on the opposite side wall, one of $Al_2O_3$ and one of Si. The thicknesses of the $Al_2O_3$ and Si protecting layers were a quarter wavelength.

Figure 6:
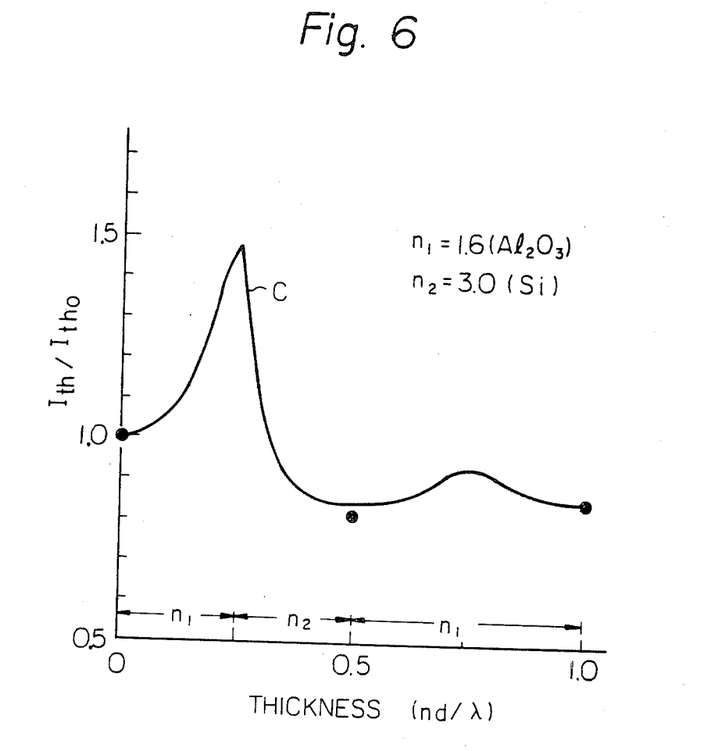
FIG. 6 is a graph showing the relationship between the threshold current of semiconductor lasers and the thickness of protecting films, said protecting films being formed in accordance with the method of the present invention.

The threshold currents of the three types of semiconductor lasers measured at the side walls coated with the half wavelength $Al_2O_3$ protecting layer are shown by the black points in FIG. 6. The ordinate of FIG. 6 indicates the ratio of the threshold current (Ith) of the three types of semiconductor lasers to that (Itho) of the semiconductor laser having the uncoated side wall, and the abscissa indicates the thickness of the protecting layer(s) on the opposite side wall. Furthermore, the sholid curve C shows the calculated result, assuming that the refractive index $n_1$ of $Al_2O_3$ is 1.6 and the refractive index $n_2$ of Si is 3.0.

Although the invention has been described with reference to the preferred embodiments and examples thereof, it will be understood by those skilled in the art that modification of the embodiments in form and details may be carried out without departing from the spirit and scope of the invention. For example, an ion bombarding, an ion etching or an ion milling can be utilized instead of the sputtering. Furthermore, the protecting film may be made of two or more protecting layers.

What we claim is:

1. A method for forming a protecting film on the side walls of a semiconductor device comprising the steps of:
   forming a plurality of electrodes on at least one surface of a semiconductor substrate;
   cleaving said substrate into a plurality of portions, each said portion having at least one of said electrodes;
   placing said substrate portions on the surface of a substrate target made of a protecting film material so that said side walls are oriented essentially perpendicularly to said substrate target;
   placing said substrate target with each said substrate portion in an atmosphere including energetic particles; and
   impinging said energetic particles against said substrate target, so that particles of said protecting film material are sputtered from said substrate target and deposited on said side walls of each said substrate portion to form said protecting film, while simultaneously, said energetic particles sputter-etch the exposed ones of said electrodes and the exposed portions of said semiconductor substrate surface.

2. A method according to claim 1, wherein said semiconductor device comprises at least one exposed PN junction on at least one of said side walls.

3. A method according to claim 2, wherein said device comprises an electro luminescence device.

4. A method according to claim 2, wherein said device is a photo *detector*.

5. A method according to claim 2, wherein said semiconductor device having an exposed PN junction is a diode.

6. A method according to claim 2, wherein said semiconductor device is a Gunn-diode comprising at least one exposed active area on at least one of said side walls coated with said protecting film.

7. A method according to claim 1 or 2, wherein each said protecting film is made of at least one material selected from the group consisting of $Al_2O_3$, $SiO_2$, $Si_3N_4$, $TiO_2$, SiC, BN, $CaF_2$, $MgF_2$, AlF, Si, Ge, GaAs, GaAlAs, GaP, InP, InGaAs, InGaAsP and InGaAsSb.

8. A method according to claim 2, said device comprising an optical device having a characteristic wavelength, wherein the optical thickness of said protecting film is a half wavelength of said characteristic wavelength of said optical device.

9. A method according to claim 2, said device comprising an optical device having a characteristic wavelength, wherein the optical thickness of said protecting film is a quarter wavelength of said characteristic wavelength of said optical device.

10. A method according to claim 4, wherein the optical thickness of said protecting film of said photo detector is a quarter wavelength of the maximum spectral sensitivity of said photo detector.

11. A method according to claim 2, wherein said protecting film comprises a plurality of protecting layers on at least one of said side walls of the device.

12. A method according to claim 11, wherein said protecting film comprises three protecting layers on said at least one of said side walls of the device.

13. A method according to claim 12, wherein the first and third protecting layers of said three protecting layers are made of at least one material selected from the group consisting of $Al_2O_3$, $SiO_2$, SiC, BN, $CaF_2$, $MgF_2$ and AlF, and the second protecting layer has a higher refractive index than that of said first and third protecting layers.

14. A method according to claim 13, wherein said second protecting film is a metal layer comprising a material selected from the group consisting of Au, Ag, Ti, W and Al.

15. A method according to claim 13, wherein said second protecting layer having the higher refractive index comprises at least one material selected from the group consisting of Si, Ge, GaAs, GaAlAs, GaP, InP, InGaAs, InGaAsP and InGaAsSb.

16. A method according to claim 12 or 13, said device comprising a semiconductor laser, wherein the optical thicknesses of said first, second and third protecting layers on said at least one side wall of said semiconductor laser are a quarter wavelength, a quarter wavelength and a half wavelength, respectively, of the wavelength of said laser.

17. A method according to claim 2 comprising repeating said sputtering with different substrate target materials to form at least one of said protecting layers on at least one side wall of each said semiconductor device and a plural predetermined number of protecting layers on the opposite side wall of said semiconductor device.

18. The method of claim 2, wherein each said semiconductor device is formed by the steps of:

forming said electrodes to be belt-shaped on said semiconductor substrate in parallel with a cleavage plane direction of said semiconductor substrate;

bisecting said semiconductor substrate into two equal semiconductor pieces along the direction of said cleavage plane; and repeating said bisecting along said direction to subdivide each of said semiconductor pieces into bars, each of which has one of said belt-shaped electrodes and a side wall with at least one of said protecting films as a result of selectively impinging said energetic particles against selected target materials on which said substrate portions are selectively placed, so as to have said side walls essentially perpendicular thereto.

19. A method according to claim 18, wherein each of said bars having one of said belt-shaped electrodes is divided in the perpendicular direction to said cleavage plane direction to produce each said semiconductor device.

20. The method of claim 2, wherein said device comprises a semiconductor laser.

21. The method of claim 2, wherein said device comprises a light emitting diode.

22. The method of claim 1, comprising forming a further layer selectively on said surface of said semiconductor substrate underneath said electrodes, and said impinging of said energetic particles against said substrate target and said semiconductor device comprising simultaneously sputter etching the portion of said further layer not lying under said electrodes.

23. A method according to claim 2, wherein each said electrode is formed to have an island shape in correspondence to each said semiconductor device.

* * * * *

UNITED STATES PATENT AND TRADEMARK OFFICE
CERTIFICATE OF CORRECTION

PATENT NO. : 4,435,443

DATED : March 6, 1984

INVENTOR(S) : Imai et al

It is certified that error appears in the above-identified patent and that said Letters Patent is hereby corrected as shown below:

Front page, [75] Inventors, "Kawasaki" should be --Sagamihara--.

Column 1, line 36, "1978.)." should be --1978)).--;
          line 38, "of by" should be --of--;
          line 47, "piccin" should be --picein--.

Column 4, line 46, after "wherein" insert --$\lambda$--;
          line 48, delete "," (second occurrence).

Column 5, line 10, "seconductor" should be --semiconductor--.

Column 7, line 35, "sholid" should be --solid--.

Signed and Sealed this

Second Day of July 1985

[SEAL]

Attest:

DONALD J. QUIGG

Attesting Officer

Acting Commissioner of Patents and Trademarks